(12) United States Patent
Xu et al.

(10) Patent No.: US 10,559,632 B2
(45) Date of Patent: Feb. 11, 2020

(54) DISPLAY SUBSTRATE, METHOD FOR MANUFACTURING THE SAME AND DISPLAY APPARATUS

(71) Applicant: BOE TECHNOLOGY GROUP CO., LTD., Beijing (CN)

(72) Inventors: Rui Xu, Beijing (CN); Xue Dong, Beijing (CN); Haisheng Wang, Beijing (CN); Yingming Liu, Beijing (CN); Changfeng Li, Beijing (CN); Pinchao Gu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 133 days.

(21) Appl. No.: 15/937,250

(22) Filed: Mar. 27, 2018

(65) Prior Publication Data

US 2019/0067385 A1    Feb. 28, 2019

(30) Foreign Application Priority Data

Aug. 30, 2017   (CN) .......................... 2017 1 0762661

(51) Int. Cl.
*G06K 9/00* (2006.01)
*H01L 27/32* (2006.01)
(Continued)

(52) U.S. Cl.
CPC ........ *H01L 27/3234* (2013.01); *G06K 9/0004* (2013.01); *H01L 27/288* (2013.01);
(Continued)

(58) Field of Classification Search
CPC ............... H01L 27/3234; H01L 27/288; H01L 27/3244; H01L 27/307; H01L 2227/323; H01L 27/3262; G06K 9/0004
(Continued)

(56) References Cited

U.S. PATENT DOCUMENTS 7,508,962 B2 *   3/2009   Kim .................... G02F 1/13338
                                                340/5.53
8,344,390 B2 *   1/2013   Matsumuro ........... H01L 27/283
                                                257/40
(Continued)

FOREIGN PATENT DOCUMENTS

| CN | 105047689 A | 11/2015 |
| CN | 106156753 A | 11/2016 |
| CN | 107480639 A | 12/2017 |

OTHER PUBLICATIONS

First Chinese Office Action dated Jul. 9, 2019, received for corresponding Chinese Application No. 201710762661.1.

*Primary Examiner* — Sheela C Chawan
(74) *Attorney, Agent, or Firm* — Kinney & Lange, P.A.

(57) ABSTRACT

The present disclosure provides a display substrate, a method for manufacturing the same and a display device. The display substrate includes a base substrate; light-emitting devices for displaying on the base substrate; driver thin film transistors on the base substrate for driving the light-emitting devices for displaying to emit light; optical fingerprint identification devices on the base substrate; and switch thin film transistors on the base substrate for controlling the optical fingerprint identification devices. The optical fingerprint identification devices are in a display area of the display substrate. Each film layer of each driver thin film transistor and a corresponding same film layer of each switch thin film transistor are in an identical layer and are made of the same material.

18 Claims, 7 Drawing Sheets

(51) Int. Cl.
  *H01L 27/28* (2006.01)
  *H01L 27/30* (2006.01)
(52) U.S. Cl.
  CPC ........ *H01L 27/3244* (2013.01); *H01L 27/307* (2013.01); *H01L 2227/323* (2013.01)
(58) Field of Classification Search
  USPC ....... 382/100, 115, 124, 125, 181, 209, 127, 382/116, 296, 276, 293, 312, 278, 108; 340/5.8, 5.81, 5.82, 5.83; 713/182, 186, 713/185
  See application file for complete search history.

(56) References Cited

U.S. PATENT DOCUMENTS

| | | | | |
|---|---|---|---|---|
| 8,665,234 | B2* | 3/2014 | Juan | G06F 1/22 345/173 |
| 8,704,810 | B2* | 4/2014 | Tsuchi | G09G 3/3291 345/205 |
| 9,830,879 | B2* | 11/2017 | Hekstra | G09G 3/3688 |
| 2010/0258803 | A1* | 10/2010 | Matsumuro | H01L 27/283 257/59 |
| 2012/0321149 | A1* | 12/2012 | Carver | G06K 9/0004 382/124 |
| 2015/0348504 | A1* | 12/2015 | Sakariya | G09G 3/3233 345/206 |
| 2017/0221972 | A1 | 8/2017 | Yang et al. | |

* cited by examiner

DISPLAY SUBSTRATE, METHOD FOR MANUFACTURING THE SAME AND DISPLAY APPARATUS

CROSS-REFERENCE TO RELATED APPLICATION

This application is based on and claims the priority of the Chinese patent application No. 201710762661.1 filed on Aug. 30, 2017, which is incorporated herein by reference in its entirety.

TECHNICAL FIELD

The present disclosure relates to the field of displaying technology, and in particular to a display substrate, a method for manufacturing the same and a display apparatus.

BACKGROUND

Fingerprints are inherent and unique features of the human body. A fingerprint is composed of a series of ridges and valleys on the surface of the skin. Details of the ridges and valleys usually include bifurcation of the ridge, an end of the ridge, arch, tented arch, left-handed, right-handed, spiral, or double spiral, which determine the uniqueness of the fingerprint pattern. Fingerprint identification devices developed based on the above details are used for personal authentication, and are widely used in devices such as photosensitive fingerprint identification devices and capacitive fingerprint identification devices.

When one capacitive fingerprint identification device is used to identify a fingerprint, if a distance between a finger and the capacitive fingerprint identification device is greater than 300 um, a capacitance signal will be too small to be read out. Thus, the capacitive fingerprint identification device is usually used only in a non-displaying area. For example, the capacitive fingerprint identification device may be applied to a Home button of a mobile phone, and may identify a fingerprint by means of sliding or pressing the Home button. In other words, the current fingerprint identification devices are used only at special positions such as buttons to identify fingerprints and cannot be disposed in a display area and thus, full-screen fingerprint identification cannot be achieved on display apparatuses.

SUMMARY

According to one aspect, one embodiment of the present disclosure provides a display substrate including: a base substrate; a plurality of light-emitting devices for displaying on the base substrate; a plurality of driver thin film transistors on the base substrate for driving the plurality of light-emitting devices for displaying to emit light; a plurality of optical fingerprint identification devices on the base substrate; and a plurality of switch thin film transistors on the base substrate for controlling the plurality of optical fingerprint identification devices. The plurality of optical fingerprint identification devices are in a display area of the display substrate. Each film layer of each of the plurality of driver thin film transistors and a corresponding same film layer of each of the plurality of switch thin film transistors are in an identical layer and are made of the same material.

Optionally, each of the plurality of optical fingerprint identification devices includes a first electrode, a second electrode and a light-sensitive diode between the first electrode and the second electrode; the first electrode is at a first side of the light-sensitive diode, the second electrode is at a second side of the light-sensitive diode, and the second side is closer to the plurality of driver thin film transistors than the first side; and the second electrode is coupled to a drain electrode of one of the plurality of driver thin film transistors.

Optionally, the display substrate further includes a plurality of rows of fingerprint identification gate lines on the base substrate; and a plurality of columns of fingerprint identification signal reading lines on the base substrate. A gate electrode of each of the plurality of switch thin film transistors is coupled to one of the plurality of fingerprint identification gate lines at a corresponding row, and a source electrode of each of the plurality of switch thin film transistors is coupled to one of the plurality of fingerprint identification signal reading lines at a corresponding column.

Optionally, the light-sensitive diode is a photodiode or an organic photodetector.

Optionally, the plurality of light-emitting devices for displaying are spaced apart from each other and each of the plurality of optical fingerprint identification devices is in a gap between adjacent ones of the plurality of light-emitting devices for displaying.

Optionally, the light-sensitive diode is at a side of the plurality of switch thin film transistors and the side of the plurality of switch thin film transistors is adjacent to a displaying side.

Optionally, the first electrode and the second electrode are made of transparent conductive materials. The display substrate further includes a passivation layer covering the plurality of driver thin film transistors and the plurality of switch thin film transistors. The plurality of optical fingerprint identification devices are on the passivation layer; the second electrode of each of the plurality of optical fingerprint identification devices is coupled to the drain electrode of one of the plurality of driver thin film transistors through a via hole extending through the passivation layer. The display substrate further includes a planarization layer covering the plurality of optical fingerprint identification devices. The plurality of light-emitting devices for displaying are on the planarization layer.

Optionally, the plurality of driver thin film transistors and the plurality of switch thin film transistors are directly on the base substrate.

Optionally, there is a gap between adjacent ones of the plurality of light-emitting devices for displaying, and the gap allows light to pass through. The display substrate further includes an insulation layer covering the plurality of optical fingerprint identification devices. The plurality of driver thin film transistors and the plurality of switch thin film transistors are on the insulation layer. The drain electrode of each of the plurality of switch thin film transistors is coupled to the second electrode of one of the plurality of optical fingerprint identification devices through a via hole extending through the insulation layer. The display substrate further includes a passivation layer covering the plurality of driver thin film transistors and the plurality of switch thin film transistors. The plurality of light-emitting devices for displaying are on the passivation layer.

Optionally, the plurality of optical fingerprint identification devices are directly on the base substrate.

Optionally, the display substrate further includes a plurality of fingerprint identification light-emitting devices on the base substrate. The plurality of fingerprint identification light-emitting devices are configured to emit light rays to a user finger when the user finger touches the display substrate. Each film layer of each of the plurality of fingerprint identification light-emitting devices and a corresponding same film layer of each of the plurality of light-emitting devices for displaying are in an identical layer and are made of the same material.

Optionally, the plurality of fingerprint identification light-emitting devices are green light-emitting devices.

One embodiment of the present disclosure further provides a display apparatus including the above display substrate.

One embodiment of the present disclosure further provides a method for manufacturing a display substrate, including: forming a plurality of light-emitting devices for displaying on a base substrate, and forming a plurality of driver thin film transistors on the base substrate for driving the plurality of light-emitting devices for displaying to emit light; and forming a plurality of optical fingerprint identification devices on the base substrate and a plurality of switch thin film transistors on the base substrate for controlling the plurality of optical fingerprint identification devices in such a manner that the plurality of optical fingerprint identification devices are in a display area of the display substrate and each film layer of each of the plurality of driver thin film transistors and a corresponding same film layer of each of the plurality of switch thin film transistors are formed simultaneously through the same patterning process.

Optionally, the plurality of light-emitting devices for displaying are spaced apart from each other. The forming a plurality of optical fingerprint identification devices on the base substrate includes: forming the plurality of optical fingerprint identification devices in a gap between adjacent ones of the plurality of light-emitting devices for displaying.

Optionally, the forming a plurality of light-emitting devices for displaying on a base substrate, and forming a plurality of driver thin film transistors on the base substrate for driving the plurality of light-emitting devices for displaying to emit light as well as the forming a plurality of optical fingerprint identification devices on the base substrate and a plurality of switch thin film transistors on the base substrate for controlling the plurality of optical fingerprint identification device, includes: forming the plurality of driver thin film transistors and the plurality of switch thin film transistors directly on the base substrate; forming a passivation layer covering the plurality of driver thin film transistors and the plurality of switch thin film transistors with via holes through which drain electrodes of the plurality of switch thin film transistors are exposed; forming the plurality of optical fingerprint identification devices on the passivation layer with electrodes of the plurality of optical fingerprint identification devices being connected with the respective drain electrodes of the plurality of switch thin film transistors through the via holes; forming a planarization layer covering the plurality of optical fingerprint identification devices; and forming the plurality of light-emitting devices for displaying on the planarization layer.

Optionally, the forming a plurality of light-emitting devices for displaying on a base substrate, and forming a plurality of driver thin film transistors on the base substrate for driving the plurality of light-emitting devices for displaying to emit light as well as the forming a plurality of optical fingerprint identification devices on the base substrate and a plurality of switch thin film transistors on the base substrate for controlling the plurality of optical fingerprint identification devices, includes: forming the plurality of optical fingerprint identification devices directly on the base substrate; forming an insulation layer covering the plurality of optical fingerprint identification devices with via holes through which electrodes of the optical fingerprint identification devices are exposed; forming the plurality of driver thin film transistors and the plurality of switch thin film transistors on the insulation layer in such a manner that drain electrodes of the plurality of switch thin film transistors are coupled to the respective electrodes of the plurality of optical fingerprint identification devices through the via holes extending through the insulation layer; forming a passivation layer covering the plurality of driver thin film transistors and the plurality of switch thin film transistors; and forming the plurality of light-emitting devices for displaying on the passivation layer.

Optionally, the method further includes: forming a plurality of fingerprint identification light-emitting devices on the base substrate that are configured to emit light rays to a user finger when the user finger touches the display substrate in such a manner that each film layer of each of the plurality of fingerprint identification light-emitting devices and a corresponding same film layer of each of the plurality of light-emitting devices for displaying are formed simultaneously through the same process.

DETAILED DESCRIPTION

Detailed description of the exemplary embodiments will be made herein, with examples thereof to be shown in drawings. In the following description, when the drawings are referred to, unless expressed otherwise, the same number in different drawings refers to the same or similar elements. The embodiments described in the exemplary embodiments below do not represent all embodiments that are consistent with the present disclosure. On the contrary, they are only examples of the devices and methods that are consistent with some of the aspects of the present disclosure as recited in the claims.

In order to solve the problems in the related art that full-screen fingerprint identification cannot be achieved on display apparatuses, one embodiment of the present disclosure provides a display substrate, a method for manufacturing the same and a display apparatus, which can integrate fingerprint identification devices into a display area of the display apparatus to realize fingerprint identification at any position of the display area and which can reduce costs of the display apparatus.

One embodiment of the present disclosure provides a display substrate including a base substrate, a plurality of light-emitting devices for displaying on the base substrate, and a plurality of driver thin film transistors on the base substrate. The display substrate further includes a plurality of optical fingerprint identification devices on the base substrate, and a plurality of switch thin film transistors on the base substrate for controlling the optical fingerprint identification devices. The optical fingerprint identification devices are in a display area of the display substrate. Each film layer of the driver thin film transistor and a corresponding same film layer of the switch thin film transistor are in an identical layer, and are made of the same material. In other words, the driver thin film transistor and the switch thin film transistor can be manufactured simultaneously.

In this embodiment, the optical fingerprint identification devices are disposed in the display area of the display substrate, and the driver thin film transistors and the switch thin film transistors for controlling the optical fingerprint identification devices can be manufactured simultaneously, so that the optical fingerprint identification devices and the switch thin film transistors can be integrated into the display area of the display substrate, thereby realizing fingerprint identification at any position of the display area. Further, since the optical fingerprint identification devices are provided within the display substrate rather than being added on an outside of the display substrate, an overall thickness of the apparatus can be reduced. In addition, since each film layer of the driver thin film transistor and a corresponding same film layer of the switch thin film transistor are formed simultaneously though the same patterning process, the number of iterations of patterning processes for the display substrate can be reduced, thereby reducing the costs of the display substrate.

The switch thin film transistor and the driver thin film transistor may be fabricated through a low temperature poly-silicon (LTPS) manufacturing process, i.e., active layers of the switch thin film transistor and the driver thin film transistor may be formed of the low temperature poly-silicon. Of course, the active layers of the switch thin film transistor and the driver thin film transistor may be made of other semiconductor materials such as amorphous silicon and metal oxide semiconductor.

Figure 1:
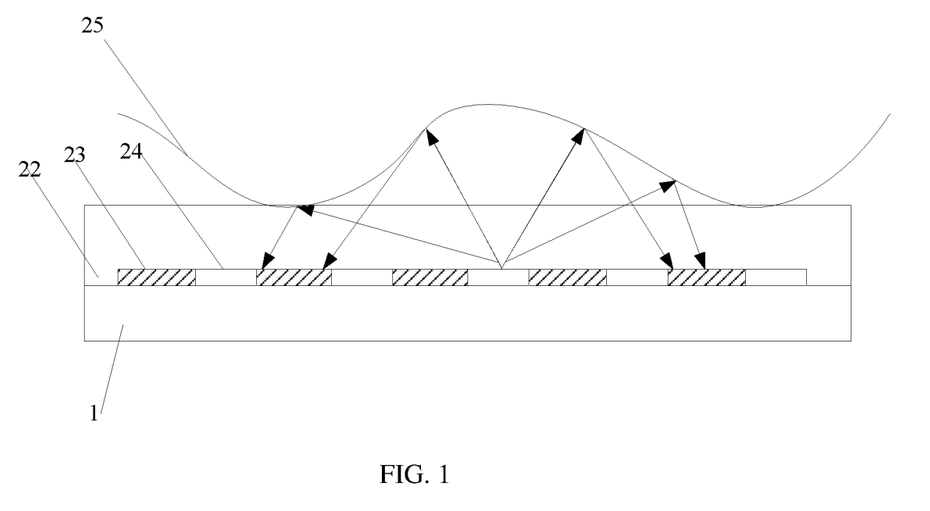
FIG. 1 is a schematic diagram showing a process of identifying a fingerprint with optical fingerprint identification devices according to an embodiment of the present disclosure.

FIG. 1 is a schematic diagram showing a process of identifying a fingerprint with optical fingerprint identification devices according to an embodiment of the present disclosure. The display substrate including a base substrate 1, a plurality of optical fingerprint identification devices 23 on the base substrate 1, a plurality of light-emitting devices 24 for displaying on the base substrate 1, and an encapsulation structure 22 for packaging the optical fingerprint identification devices 23 and the light-emitting devices 24 on the base substrate 1. When a user finger 25 touches the display substrate, light emitted from the light-emitting devices 24 is reflected by the finger to the optical fingerprint identification devices 23, and the optical fingerprint identification devices 23 identifies a fingerprint according to a received light signal.

Optionally, the optical fingerprint identification device 23 includes a first electrode, a second electrode and a light-sensitive diode between the first electrode and the second electrode. The first electrode is at a first side of the light-sensitive diode, the second electrode is at a second side of the light-sensitive diode, and the second side is closer to the driver thin film transistor than the first side. The first electrode is coupled to a signal line. The second electrode is coupled to a drain electrode of the driver thin film transistor.

Optionally, the display substrate further includes a plurality of rows of fingerprint identification gate lines on the base substrate, and a plurality of columns of fingerprint identification signal reading lines on the base substrate. A gate electrode of the switch thin film transistor is coupled to the fingerprint identification gate line at a corresponding row. A source electrode of the switch thin film transistor is coupled to the fingerprint identification signal reading line at a corresponding column.

Figure 2:
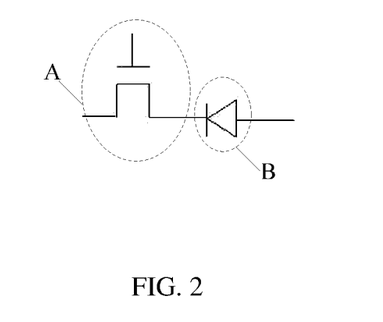
FIG. 2 is a schematic circuit diagram showing an optical fingerprint identification device coupled with one switch thin film transistor according to an embodiment of the present disclosure.

FIG. 2 is a schematic circuit diagram showing an optical fingerprint identification device coupled with one switch thin film transistor according to an embodiment of the present disclosure. As shown in FIG. 2, the optical fingerprint identification device may include a light-sensitive diode B. The light-sensitive diode B is coupled to a switch thin film transistor A. A gate electrode of the switch thin film transistor A is coupled to a fingerprint identification gate line. A source electrode of the switch thin film transistor A is coupled to a fingerprint identification signal reading line. When identifying a fingerprint, the light-sensitive diode B receives a light signal and then generates an electrical signal. The gate electrode of the switch thin film transistor A is opened, and conduction between the fingerprint identification signal reading line and a drain electrode of the switch thin film transistor A is formed so that the fingerprint identification signal reading line is connected with the light-sensitive diode B and is able to read the electrical signal of the light-sensitive diode B.

Optionally, the light-sensitive diode may be a photodiode or an organic photodetector. Of course, the light-sensitive diode may employ other kinds of diodes such as an inorganic diode.

In one embodiment, the light-emitting devices for displaying are spaced apart from each other. The optical fingerprint identification device is positioned in a gap between adjacent light-emitting devices for displaying. Optionally, the light-sensitive diode may be at a side of the switch thin film transistor, and the side of the switch thin film transistor is adjacent to a displaying side. In this way, the switch thin film transistor does not block light rays reflected by the user finger, so that the light rays reflected by the user finger can be irradiated on the light-sensitive diode.

Figure 3:
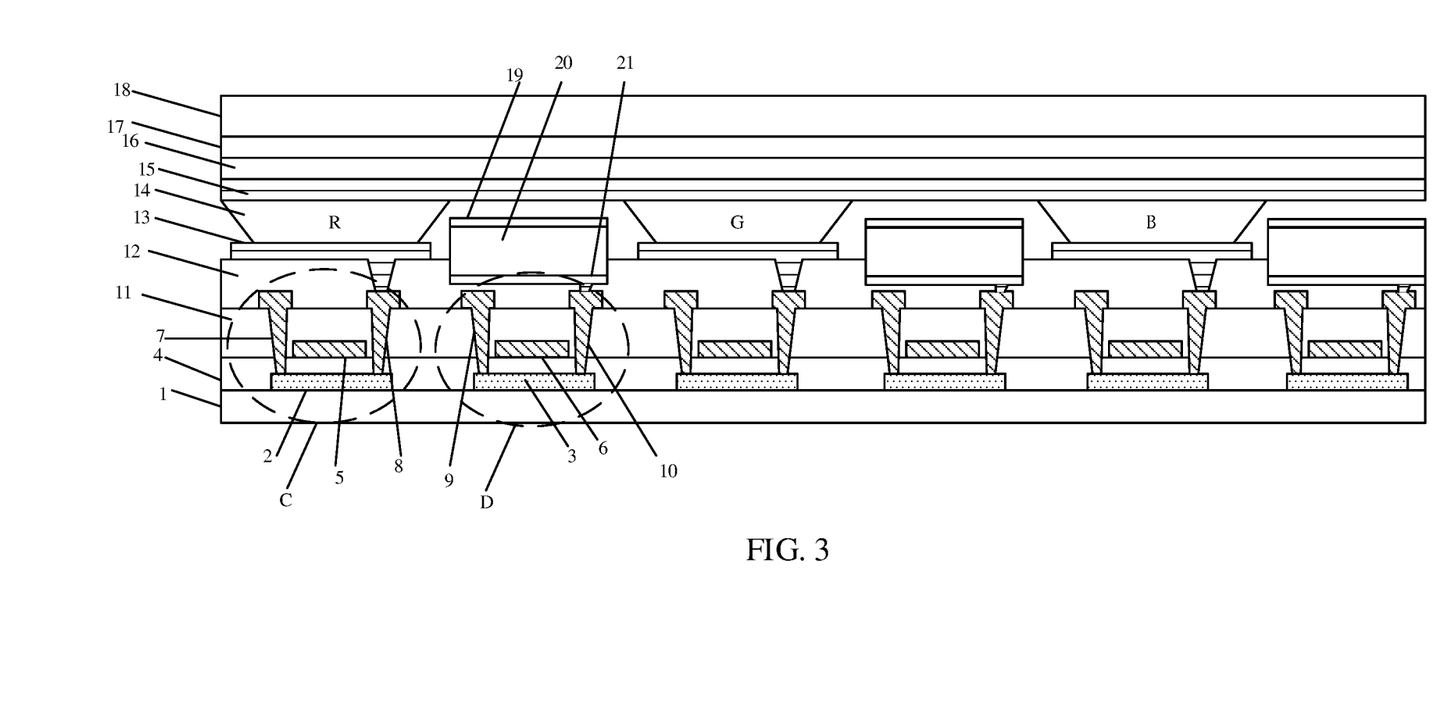
FIG. 3 is a schematic view of a display substrate according to an embodiment of the present disclosure.
Figure 4:
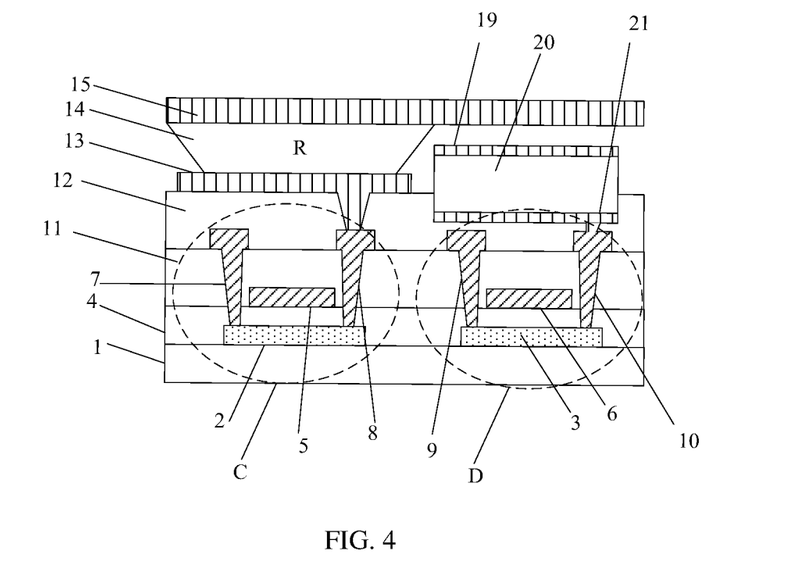
FIG. 4 is an enlarged view of a part of the display substrate shown in FIG. 3.

In one embodiment, as shown in FIGS. 3 and 4, the display substrate includes a driver thin film transistor C on the base substrate 1 and a switch thin film transistor D on the base substrate 1. The driver thin film transistor C includes an active layer 2, a gate insulation layer 4, a gate electrode 5, a source electrode 7 and a drain electrode 8. The switch thin film transistor D includes an active layer 3, a gate electrode 6, a gate insulation layer 4, a source electrode 9 and a drain electrode 10. It can be seen that the active layer 2 of the driver thin film transistor C and the active layer 3 of the switch thin film transistor D are in an identical layer and made of the same material. The gate electrode 5 of the driver thin film transistor C and the gate electrode 6 of the switch thin film transistor D are in an identical layer and made of the same material. The source electrode 7 and the drain electrode 8 of the driver thin film transistor C and the source electrode 9 and the drain electrode 10 of the switch thin film transistor D are in an identical layer and made of the same material.

The display substrate further includes an insulation layer 11, a passivation layer 12 and light-emitting devices for displaying on the passivation layer 12. The light-emitting device for displaying includes an anode 13, a cathode 15 and an organic luminescence layer 14 between the anode 13 and the cathode 15. The optical fingerprint identification device on the base substrate 1 includes a first electrode 19, a second electrode 21 and a light-sensitive diode 20 between the first electrode 19 and the second electrode 21. The first electrode 19 is coupled to a signal line. The second electrode 21 is coupled to a drain electrode 10 of the switch thin film transistor D through a via hole. In addition, the display substrate is covered with a film packaging layer 16, a polarizer 17 and an encapsulating cover plate 18.

As can be seen from FIGS. 3 and 4, there is a gap between adjacent light-emitting devices for displaying, and the switch thin film transistor D and optical fingerprint identification device are in the gap. By means of the gap, the optical fingerprint identification device can sense the light rays reflected by the user finger and then identify a fingerprint. The switch thin film transistor D is at a non-displaying side. In this way, the switch thin film transistor D does not block light rays reflected by the user finger, so that the light rays reflected by the user finger can be irradiated on the light-sensitive diode 20.

The greater the area of the light-sensitive diode 20, the greater a photoelectric conversion current, and the higher an accuracy of fingerprint recognition. Thus, when there is gap between adjacent light-emitting devices and the gap allows light to pass therethrough, a direction of light for identifying fingerprints may be changed by means of a certain light path design, and the light for identifying fingerprints may be incident from a light incident surface of the display substrate. At this point, the light-sensitive diode of large area may be fabricated on the base substrate 1. For example, as shown in FIGS. 5 and 6, the light-sensitive diode 20 may be first fabricated on the base substrate 1, and then the switch thin film transistor D and the driver thin film transistor C may be fabricated.

Figure 5:
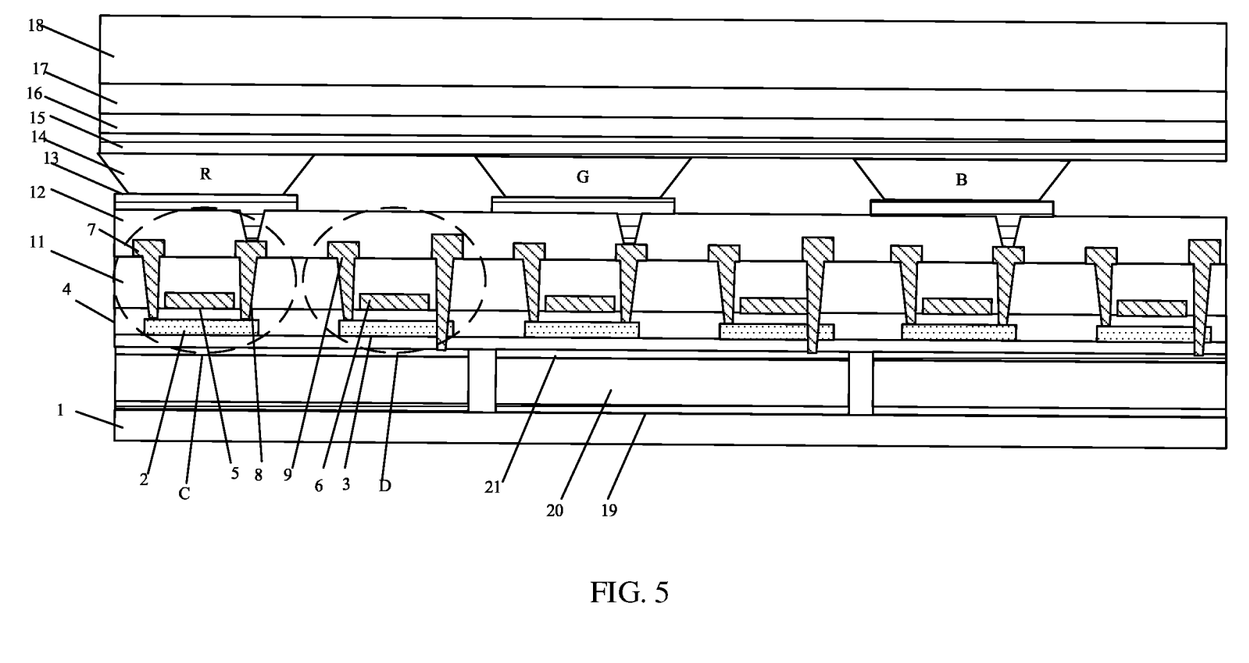
FIG. 5 is a schematic view of a display substrate according to another embodiment of the present disclosure.
Figure 6:
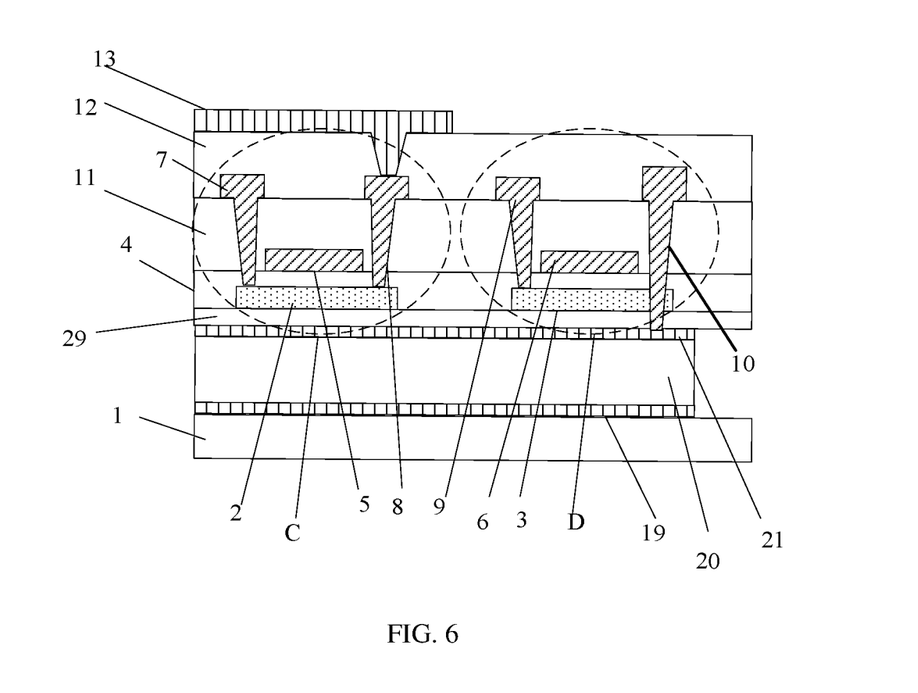
FIG. 6 is an enlarged view of a part of the display substrate shown in FIG. 5.

In another embodiment, as shown in FIGS. 5 and 6, the display substrate includes a base substrate 1 and optical fingerprint identification devices on the base substrate 1. The optical fingerprint identification device includes a first electrode 19, a second electrode 21 and a light-sensitive diode 20 between the first electrode 19 and the second electrode 21. The display substrate further includes an insulation layer 29 (as shown in FIG. 6) covering the optical fingerprint identification devices, a driver thin film transistor C on the insulation layer and a switch thin film transistor D on the insulation layer. The driver thin film transistor C includes an active layer 2, a gate insulation layer 4, a gate electrode 5, a source electrode 7 and a drain electrode 8. The switch thin film transistor D includes an active layer 3, a gate electrode 6, a gate insulation layer 4, a source electrode 9 and a drain electrode 10. The first electrode 19 of the optical fingerprint identification device is coupled to a signal line. The second electrode 21 is coupled to a drain electrode 10 of the switch thin film transistor D through a via hole.

As can be seen from FIGS. 5 and 6, the active layer 2 of the driver thin film transistor C and the active layer 3 of the switch thin film transistor D are in an identical layer and made of the same material. The gate electrode 5 of the driver thin film transistor C and the gate electrode 6 of the switch thin film transistor D are in an identical layer and made of the same material. The source electrode 7 and the drain electrode 8 of the driver thin film transistor C and the source electrode 9 and the drain electrode 10 of the switch thin film transistor D are in an identical layer and made of the same material.

The display substrate further includes an insulation layer 11, a passivation layer 12 and light-emitting devices for displaying on the passivation layer 12. The light-emitting device for displaying includes an anode 13, a cathode 15 and an organic luminescence layer 14 between the anode 13 and the cathode 15. In addition, the display substrate is covered with a film packaging layer 16, a polarizer 17 and an encapsulating cover plate 18.

In this embodiment, the light for identifying fingerprints may be incident from a bottom surface of the display substrate. The optical fingerprint identification device can sense the light rays that are reflected by the user finger and incident from the bottom surface of the display substrate, and then identifies a fingerprint.

Optionally, when the first electrode and the second electrode of the optical fingerprint identification device are made of transparent conductive materials, since the optical fingerprint identification device does not block the light rays, the optical fingerprint identification device may be disposed on the driver thin film transistor and the switch thin film transistor, so that an area of the optical fingerprint identification device may be maximized and the optical fingerprint identification device is much closer to the user finger so as to sense the user's fingerprint in a better manner.

In another embodiment, when the optical fingerprint identification device is disposed on the driver thin film transistor and the switch thin film transistor, the display substrate specifically includes: the driver thin film transistor and the switch thin film transistor on the base substrate; the passivation layer covering the driver thin film transistor and the switch thin film transistor; the optical fingerprint identification device on the passivation layer, where the second electrode of the optical fingerprint identification device is coupled to the drain electrode of the switch thin film transistor by means of a via hole extending through the passivation layer; a planarization layer covering the optical fingerprint identification device; and light-emitting devices for displaying on the planarization layer.

Figure 7:
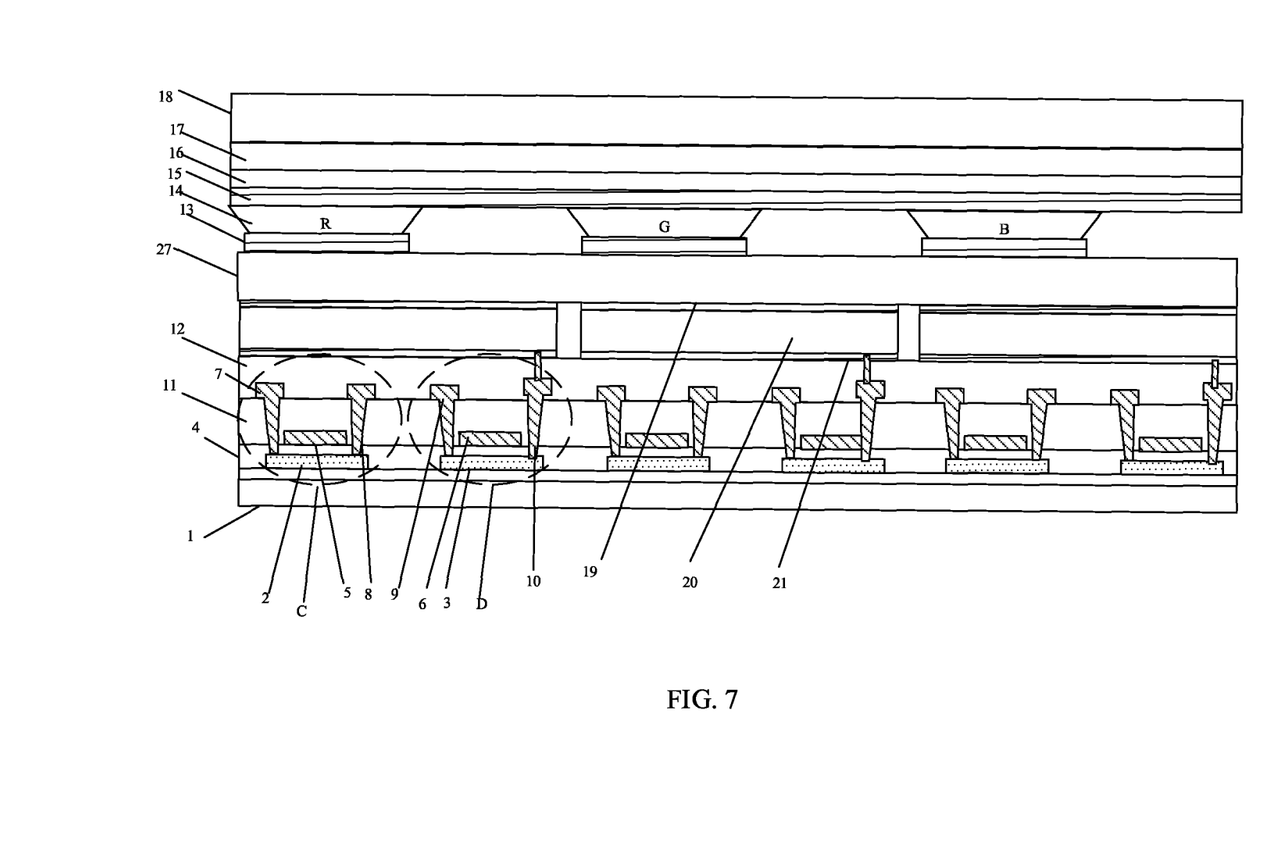
FIG. 7 is a schematic view of a display substrate according to still another embodiment of the present disclosure.

In one embodiment, as shown in FIG. 7, the display substrate includes a base substrate 1, a driver thin film transistor C on the base substrate 1 and a switch thin film transistor D on the base substrate 1. The driver thin film transistor C includes an active layer 2, a gate insulation layer 4, a gate electrode 5, a source electrode 7 and a drain electrode 8. The switch thin film transistor D includes an active layer 3, a gate electrode 6, a gate insulation layer 4, a source electrode 9 and a drain electrode 10. It can be seen that the active layer 2 of the driver thin film transistor C and the active layer 3 of the switch thin film transistor D are in an identical layer and made of the same material. The gate electrode 5 of the driver thin film transistor C and the gate electrode 6 of the switch thin film transistor D are in an identical layer and made of the same material. The source electrode 7 and the drain electrode 8 of the driver thin film transistor C and the source electrode 9 and the drain electrode 10 of the switch thin film transistor D are in an identical layer and made of the same material. The display substrate further includes an insulation layer 11, a passivation layer 12 and optical fingerprint identification devices on the passivation layer 12. The optical fingerprint identification device includes a first electrode 19, a second electrode 21 and a light-sensitive diode 20 between the first electrode 19 and the second electrode 21. The first electrode 19 is coupled to a signal line. The second electrode 21 is coupled to a drain electrode 10 of the switch thin film transistor D through a via hole. The display substrate further includes a planarization layer 27 covering the optical fingerprint identification device, and light-emitting devices for displaying on the planarization layer 27. The light-emitting device for displaying includes an anode 13, a cathode 15 and an organic luminescence layer 14 between the anode 13 and the cathode 15. In addition, the display substrate is covered with a film packaging layer 16, a polarizer 17 and an encapsulating cover plate 18. In addition, there is a gap between the optical fingerprint identification devices, the anode 13 of the light-emitting device for displaying may be coupled to the drain electrode 8 of the driver thin film transistor C through the gap between the optical fingerprint identification devices as well as the via hole extending through the planarization layer 27 and the passivation layer 12.

Figure 8:
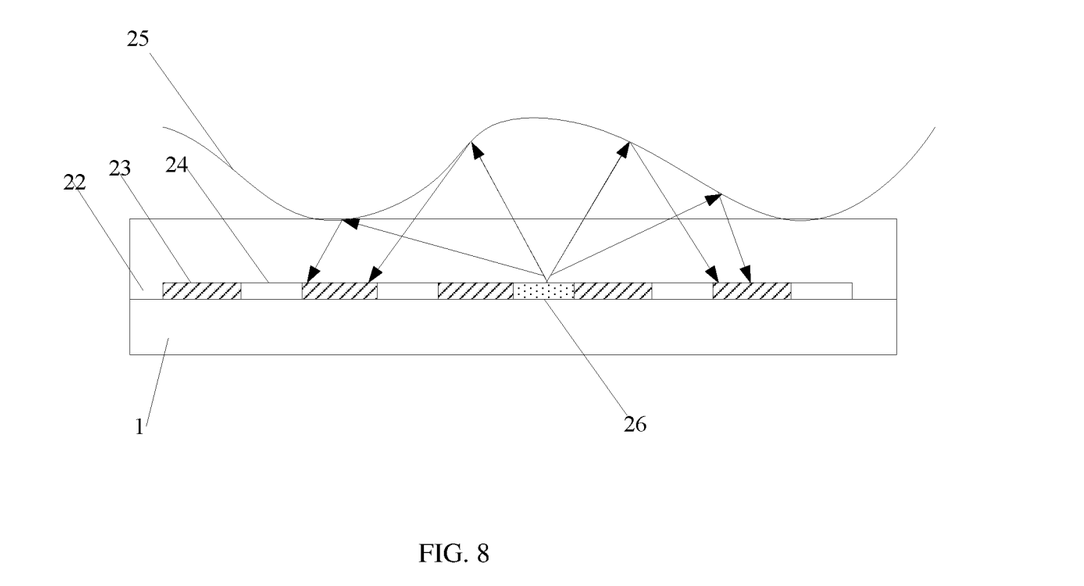
FIG. 8 is a schematic diagram showing a process of identifying a fingerprint with optical fingerprint identification devices according to another embodiment of the present disclosure.

Optionally, as shown in FIG. 8, the display substrate further includes fingerprint identification light-emitting devices 26 that are to emit light rays to the user's finger when the user's finger touches the display substrate.

Each film layer of the fingerprint identification light-emitting device 26 and a corresponding same film layer of the light-emitting device for displaying are in an identical layer, and are made of the same material. One fingerprint identification light-emitting device 26 may be disposed every default number of light-emitting devices for displaying. The default number could be five, ten or thirty, for example. When the user finger touches the display substrate, the special fingerprint identification light-emitting device emits light rays toward the user's finger to enhance light intensity, thereby identifying a fingerprint in a better manner, improving accuracy of fingerprint identification.

Optionally, since green organic light emitting material has a high luminous efficiency, the fingerprint identification light-emitting device may employ a green light-emitting device.

In this embodiment, the display substrate may be an organic light-emitting diode (OLED) display substrate. The base substrate 1 may be a flexible base substrate, for example, a polyimide (PI) substrate.

One embodiment of the present disclosure further provides a display apparatus including the above display substrate. The display apparatus may be any product or component having displaying function, such as a television, a monitor, a digital photo frame, a mobile phone and a tablet computer. The display apparatus further includes a flexible circuit board, a printed circuit board and a back plate.

One embodiment of the present disclosure further provides a method for manufacturing a display substrate, including: forming a plurality of light-emitting devices for displaying on a base substrate, and forming a plurality of driver thin film transistors on the base substrate; and forming a plurality of optical fingerprint identification devices on the base substrate, and forming a plurality of switch thin film transistors on the base substrate for controlling the optical fingerprint identification devices in such a manner that the optical fingerprint identification devices are in a display area of the display substrate and each film layer of the driver thin film transistor and a corresponding same film layer of the switch thin film transistor are formed simultaneously through the same patterning process.

In this embodiment, the optical fingerprint identification devices are disposed in the display area of the display substrate, and the driver thin film transistors and the switch thin film transistors of the optical fingerprint identification devices can be manufactured simultaneously, so that the optical fingerprint identification devices and the switch thin film transistors can be integrated into the display area of the display substrate, thereby realizing fingerprint identification at any position of the display area. Further, since the optical fingerprint identification devices are provided within the display substrate rather than being added on an outside of the display substrate, an overall thickness of the apparatus can be reduced. In addition, since each film layer of the driver thin film transistor and a corresponding same film layer of the switch thin film transistor are formed simultaneously though the same patterning process, the number of iterations of patterning processes for the display substrate can be reduced, thereby reducing the costs of the display substrate.

In one embodiment, the light-emitting devices for displaying are spaced apart from each other. The method includes: forming the optical fingerprint identification device in a gap between adjacent light-emitting devices for displaying. When the optical fingerprint identification device is in the gap, the optical fingerprint identification device can sense the light rays reflected by the user finger through the gap and then identify a fingerprint.

In another embodiment, the method includes: forming driver thin film transistors and switch thin film transistors on the base substrate; forming a passivation layer covering the driver thin film transistors and the switch thin film transistors with via holes through which drain electrodes of the switch thin film transistors are exposed; forming optical fingerprint identification devices on the passivation layer with electrodes of the optical fingerprint identification devices extending through the via holes to be connected with the drain electrodes of the switch thin film transistors, respectively; forming a planarization layer covering the optical fingerprint identification devices; and forming light-emitting devices for displaying on the planarization layer.

When the second electrode of the optical fingerprint identification device is also made of transparent conductive materials, since the optical fingerprint identification device does not block the light rays, the optical fingerprint identification device may be disposed on the driver thin film transistor and the switch thin film transistor, so that an area of the optical fingerprint identification device may be maximized and the optical fingerprint identification device is much closer to the user finger so as to sense the user's fingerprint in a better manner.

In another embodiment, the method includes: forming optical fingerprint identification devices on a base substrate; forming an insulation layer covering the optical fingerprint identification devices with via holes through which electrodes of the optical fingerprint identification devices are exposed; forming driver thin film transistors and switch thin film transistors on the insulation layer in such a manner that drain electrodes of the switch thin film transistors are coupled to the electrodes of the optical fingerprint identification devices through the via holes extending through the insulation layer; forming a passivation layer covering the driver thin film transistors and switch thin film transistors; and forming light-emitting devices for displaying on the passivation layer.

The greater an area of the light-sensitive diode, the greater a photoelectric conversion current, and the higher an accuracy of fingerprint recognition is. Thus, when there is a gap between adjacent light-emitting devices and the gap allows light to pass therethrough, a direction of light for identifying fingerprints may be changed by means of a certain light path design, and the light for identifying fingerprints may be incident from a light incident surface of the display substrate. At this point, the light-sensitive diode having large area may be fabricated on the base substrate. The optical fingerprint identification device can sense the light rays incident from the bottom surface of the display substrate, and then identify a fingerprint.

Optionally, the method further includes forming fingerprint identification light-emitting devices on the base substrate that are to emit light rays to the user finger when the user finger touches the display substrate. Each film layer of the fingerprint identification light-emitting device and a corresponding same film layer of the light-emitting device for displaying are formed simultaneously through the same process. When the user's finger touches the display substrate, the special fingerprint identification light-emitting device emits light rays towards the user's finger to enhance light intensity, thereby identifying a fingerprint in a better manner and then improving accuracy of fingerprint identification.

Optionally, since green organic light emitting material has a high luminous efficiency, the fingerprint identification light-emitting device may employ a green light-emitting device.

Unless otherwise defined, any technical or scientific terms used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than being limited to physical or mechanical connection. Such words as "on/above", "under/below", "left" and "right" are merely used to represent relative position relationship, and when an absolute position of an object is changed, the relative position relationship will be changed too.

It should be understand that when a component such as a layer, a film, an areas or a substrate is referred to as being disposed on or below another component, the component may be directly on or below the another component, or there may be an intermediate component therebetween.

The above are merely the preferred embodiments of the present disclosure. A person skilled in the art may make further modifications and improvements without departing from the principle/spirit of the present disclosure, and these modifications and improvements shall also fall within the scope of the present disclosure.

LIST OF REFERENCE NUMERALS 1 base substrate
2 active layer of driver thin film transistor
3 active layer of switch thin film transistor
4 gate insulation layer
5 gate electrode of driver thin film transistor
6 gate electrode of switch thin film transistor
7 source electrode of driver thin film transistor
8 drain electrode of driver thin film transistor
9 source electrode of switch thin film transistor
10 drain electrode of switch thin film transistor
11 interlayer insulation layer
12 passivation layer
13 anode
14 organic luminescence layer
15 cathode
16 film packaging layer
17 polarizer
18 encapsulating cover plate
19 first electrode
20 light-sensitive diode
21 second electrode
22 encapsulation structure
23 optical fingerprint identification device
24 light-emitting device
25 user finger
26 fingerprint identification light-emitting device
27 planarization layer
A, D switch thin film transistor
B light-sensitive diode
C driver thin film transistor

What is claimed is:

1. A display substrate comprising:
    a base substrate;
    a plurality of light-emitting devices on the base substrate for displaying;
    a plurality of driver thin film transistors on the base substrate for driving the plurality of light-emitting devices to emit light;
    a plurality of optical fingerprint identification devices on the base substrate; and
    a plurality of switch thin film transistors on the base substrate for controlling the plurality of optical fingerprint identification devices;
    wherein the plurality of optical fingerprint identification devices are in a display area of the display substrate; and
    wherein each film layer of each of the plurality of driver thin film transistors and a corresponding same film layer of each of the plurality of switch thin film transistors are in an identical layer and are made of a same material.

2. The display substrate of claim 1, wherein each of the plurality of optical fingerprint identification devices comprises a first electrode, a second electrode and a light-sensitive diode between the first electrode and the second electrode, and wherein the first electrode is at a first side of the light-sensitive diode, the second electrode is at a second side of the light-sensitive diode, and wherein the second side is closer to the plurality of driver thin film transistors than the first side, and wherein the second electrode is coupled to a drain electrode of one of the plurality of driver thin film transistors.

3. The display substrate of claim 2, further comprising:
    a plurality of rows of fingerprint identification gate lines on the base substrate; and
    a plurality of columns of fingerprint identification signal reading lines on the base substrate;
    wherein a gate electrode of each of plurality of switch thin film transistors is coupled to a corresponding one of the plurality of rows of fingerprint identification gate lines, and a source electrode of each of the plurality of switch thin film transistors is coupled to a corresponding one of the plurality of columns of fingerprint identification signal reading lines.

4. The display substrate of claim 2, wherein the light-sensitive diode is a photodiode or an organic photodetector.

5. The display substrate of claim 2, wherein the plurality of light-emitting devices for displaying are spaced apart from each other and each of the plurality of optical fingerprint identification devices is in a gap between adjacent ones of the plurality of light-emitting devices for displaying.

6. The display substrate of claim 5, wherein the light-sensitive diode is at a side of the plurality of switch thin film transistors and the side of the plurality of switch thin film transistors is adjacent to a displaying side.

7. The display substrate of claim 2, wherein:
the first electrode and the second electrode are made of transparent conductive materials;
the display substrate further comprises a passivation layer covering the plurality of driver thin film transistors and the plurality of switch thin film transistors;
the plurality of optical fingerprint identification devices are on the passivation layer;
the second electrode of each of the plurality of optical fingerprint identification devices is coupled to the drain electrode of one of the plurality of driver thin film transistors through a via hole extending through the passivation layer;
the display substrate further comprises a planarization layer covering the plurality of optical fingerprint identification devices; and
the plurality of light-emitting devices for displaying are on the planarization layer.

8. The display substrate of claim 7, wherein the plurality of driver thin film transistors and the plurality of switch thin film transistors are directly on the base substrate.

9. The display substrate of claim 2, wherein:
there is a gap between adjacent ones of the plurality of light-emitting devices for displaying, and the gap allows light to pass through;
the display substrate further comprises an insulation layer covering the plurality of optical fingerprint identification devices;
the plurality of driver thin film transistors and the plurality of switch thin film transistors are on the insulation layer;
the second electrode of each of the plurality of optical fingerprint identification devices is coupled to the drain electrode of one of the plurality of switch thin film transistors through a via hole extending through the insulation layer;
the display substrate further comprises a passivation layer covering the plurality of driver thin film transistors and the plurality of switch thin film transistors; and
the plurality of light-emitting devices for displaying are on the passivation layer.

10. The display substrate of claim 9, wherein the plurality of optical fingerprint identification devices are directly on the base substrate.

11. The display substrate of claim 1, further comprising:
a plurality of fingerprint identification light-emitting devices on the base substrate;
wherein the plurality of fingerprint identification light-emitting devices are configured to emit light rays to a finger of a user when the finger touches the display substrate; and
wherein each film layer of each of the plurality of fingerprint identification light-emitting devices and a corresponding same film layer of each of the plurality of light-emitting devices for displaying are in an identical layer and are made of a same material.

12. The display substrate of claim 11, wherein the plurality of fingerprint identification light-emitting devices are green light-emitting devices.

13. A display apparatus comprising the display substrate of claim 1.

14. A method for manufacturing a display substrate, the method comprising:
forming a plurality of light-emitting devices for displaying on a base substrate;
forming a plurality of driver thin film transistors on the base substrate for driving the plurality of light-emitting devices for displaying to emit light; and
forming a plurality of optical fingerprint identification devices on the base substrate and a plurality of switch thin film transistors on the base substrate for controlling the plurality of optical fingerprint identification devices in such a manner that the plurality of optical fingerprint identification devices are in a display area of the display substrate and each film layer of each of the plurality of driver thin film transistors and a corresponding same film layer of each of the plurality of switch thin film transistors are formed simultaneously through the same patterning process.

15. The method of claim 14, wherein the plurality of light-emitting devices for displaying are spaced apart from each other, and wherein the forming a plurality of optical fingerprint identification devices on the base substrate comprises forming each of the plurality of optical fingerprint identification devices in a gap between adjacent ones of plurality of light-emitting devices for displaying.

16. The method of claim 14, wherein the forming the plurality of light-emitting devices for displaying on a base substrate, the forming of the plurality of driver thin film transistors on the base substrate for driving the plurality of light-emitting devices for displaying to emit light, and the forming of the plurality of optical fingerprint identification devices on the base substrate and the plurality of switch thin film transistors on the base substrate for controlling the plurality of optical fingerprint identification devices, comprises:
forming the plurality of driver thin film transistors and the plurality of switch thin film transistors directly on the base substrate;
forming a passivation layer covering the plurality of driver thin film transistors and the plurality of switch thin film transistors with via holes through which drain electrodes of the plurality of switch thin film transistors are exposed;
forming the plurality of optical fingerprint identification devices on the passivation layer with electrodes of the plurality of optical fingerprint identification devices being connected with the respective drain electrodes of the plurality of switch thin film transistors through the via holes;
forming a planarization layer covering the plurality of optical fingerprint identification devices; and
forming the plurality of light-emitting devices for displaying on the planarization layer.

17. The method of claim 14, wherein the forming the plurality of light-emitting devices for displaying on a base substrate, the forming of the plurality of driver thin film transistors on the base substrate for driving the plurality of light-emitting devices for displaying to emit light, and the forming of the plurality of optical fingerprint identification devices on the base substrate and the plurality of switch thin film transistors on the base substrate for controlling the plurality of optical fingerprint identification devices, comprises:
forming the plurality of optical fingerprint identification devices directly on the base substrate;
forming an insulation layer covering the plurality of optical fingerprint identification devices with via holes through which electrodes of the plurality of optical fingerprint identification devices are exposed;
forming the plurality of driver thin film transistors and the plurality of switch thin film transistors on the insulation layer in such a manner that drain electrodes of the plurality of switch thin film transistors are coupled to the respective electrodes of the plurality of optical fingerprint identification devices through the via holes extending through the insulation layer;

forming a passivation layer covering the plurality of driver thin film transistors and the plurality of switch thin film transistors; and forming the plurality of light-emitting devices for displaying on the passivation layer.

18. The method of claim 14, further comprising:

forming a plurality of fingerprint identification light-emitting devices on the base substrate that are configured to emit light rays to a finger of a user when the finger touches the display substrate in such a manner that each film layer of each of the plurality of fingerprint identification light-emitting devices and a corresponding same film layer of each of the plurality of light-emitting devices for displaying are formed simultaneously through the same process.

* * * * *